United States Patent
Letertre et al.

(10) Patent No.: US 8,951,887 B2
(45) Date of Patent: Feb. 10, 2015

(54) PROCESS FOR FABRICATING A SEMICONDUCTOR STRUCTURE EMPLOYING A TEMPORARY BOND

(75) Inventors: Fabrice Letertre, Grenoble (FR); Didier Landru, Champ Pres Froges (FR)

(73) Assignee: Soitec, Bernin (FR)

( * ) Notice: Subject to any disclaimer, the term of this patent is extended or adjusted under 35 U.S.C. 154(b) by 65 days.

(21) Appl. No.: 13/526,105

(22) Filed: Jun. 18, 2012

(65) Prior Publication Data

US 2012/0329243 A1 Dec. 27, 2012

(30) Foreign Application Priority Data

Jun. 23, 2011 (FR) ...................................... 11 55548

(51) Int. Cl.
*H01L 21/36* (2006.01)
*H01L 21/762* (2006.01)

(52) U.S. Cl.
CPC ................................ *H01L 21/76254* (2013.01)
USPC ............ 438/458; 257/E21.568; 257/E21.561; 257/E21.567; 257/E21.57

(58) Field of Classification Search
CPC .................................................. H01L 21/76254
USPC ................... 438/458; 257/E21.568, E21.561, 257/E21.567, E21.57
See application file for complete search history.

(56) References Cited

U.S. PATENT DOCUMENTS

| | | | |
|---|---|---|---|
| 6,150,239 A | 11/2000 | Goesele et al. | |
| 6,794,276 B2 | 9/2004 | Letertre et al. | |
| 6,815,309 B2 | 11/2004 | Letertre | |
| 6,858,107 B2 | 2/2005 | Ghyselen | |
| 6,867,067 B2 | 3/2005 | Ghyselen | |
| 6,908,828 B2 | 6/2005 | Letertre et al. | |
| 6,939,782 B2 | 9/2005 | Aspar et al. | |
| 6,946,317 B2 | 9/2005 | Faure et al. | |
| 6,964,914 B2 | 11/2005 | Ghyselen et al. | |
| 6,974,759 B2 | 12/2005 | Moriceau et al. | |
| 6,974,760 B2 | 12/2005 | Ghyselen et al. | |
| 7,008,859 B2 | 3/2006 | Letertre et al. | |
| 7,009,270 B2 | 3/2006 | Letertre et al. | |
| 7,022,586 B2 | 4/2006 | Maleville et al. | |

(Continued)

FOREIGN PATENT DOCUMENTS

CN 1745483 A 3/2006
CN 101620983 A 1/2010

(Continued)

OTHER PUBLICATIONS

Yun et al., Polycrystalline Silicon Layer Transfer by Ion-Cut, Applied Physics Letters, vol. 82, No. 10, Mar. 2003, pp. 1544-1546.

(Continued)

*Primary Examiner* — Kimberly Rizkallah
*Assistant Examiner* — Maria Ligai
(74) *Attorney, Agent, or Firm* — TraskBritt

(57) ABSTRACT

The invention relates to a process for fabricating a semiconductor that comprises providing a handle substrate comprising a seed substrate and a weakened sacrificial layer covering the seed substrate; joining the handle substrate with a carrier substrate; optionally treating the carrier substrate; detaching the handle substrate at the sacrificial layer to form the semiconductor structure; and removing any residue of the sacrificial layer present on the seed substrate.

16 Claims, 2 Drawing Sheets

(56) References Cited

U.S. PATENT DOCUMENTS

| | | | |
|---|---|---|---|
| 7,041,577 B2 | 5/2006 | Rayssac et al. | |
| 7,067,393 B2 | 6/2006 | Letertre et al. | |
| 7,071,029 B2 | 7/2006 | Ghyselen et al. | |
| 7,115,481 B2 | 10/2006 | Ghyselen et al. | |
| 7,122,095 B2 | 10/2006 | Letertre et al. | |
| 7,145,214 B2 | 12/2006 | Letertre et al. | |
| 7,163,873 B2 | 1/2007 | Letertre et al. | |
| 7,182,234 B2 | 2/2007 | Rayssac et al. | |
| 7,189,632 B2 | 3/2007 | Kerdiles et al. | |
| 7,229,898 B2 | 6/2007 | Bourdelle et al. | |
| 7,232,738 B2 | 6/2007 | Rayssac et al. | |
| 7,232,739 B2 | 6/2007 | Kerdiles et al. | |
| 7,235,462 B2 | 6/2007 | Letertre et al. | |
| 7,256,075 B2 | 8/2007 | Ghyselen et al. | |
| 7,256,101 B2 | 8/2007 | Letertre et al. | |
| 7,262,113 B2 | 8/2007 | Ghyselen et al. | |
| 7,405,135 B2 | 7/2008 | Letertre et al. | |
| 7,407,869 B2 | 8/2008 | Ghyselen et al. | |
| 7,422,958 B2 | 9/2008 | Kostrzewa et al. | |
| 7,452,785 B2 | 11/2008 | Kononchuk et al. | |
| 7,537,949 B2 | 5/2009 | Letertre et al. | |
| 7,601,217 B2 | 10/2009 | Faure et al. | |
| 7,601,611 B2 | 10/2009 | Cayrefourcq et al. | |
| 7,645,684 B2 | 1/2010 | Letertre et al. | |
| 7,646,038 B2 | 1/2010 | Faure et al. | |
| 7,741,678 B2 | 6/2010 | Ghyselen et al. | |
| 7,820,461 B2 | 10/2010 | Baptist et al. | |
| 7,863,650 B2 | 1/2011 | Letertre | |
| 7,888,235 B2 | 2/2011 | Letertre et al. | |
| 7,892,946 B2 | 2/2011 | Rayssac et al. | |
| 7,892,951 B2 | 2/2011 | Landru et al. | |
| 7,939,428 B2 | 5/2011 | Boussagol et al. | |
| 7,972,939 B2 | 7/2011 | Kerdiles et al. | |
| 7,981,767 B2 | 7/2011 | Guenard et al. | |
| 8,048,693 B2 | 11/2011 | Letertre et al. | |
| 8,058,149 B2 | 11/2011 | Maleville | |
| 8,083,115 B2 | 12/2011 | Rayssac et al. | |
| 8,093,687 B2 | 1/2012 | Letertre et al. | |
| 8,114,754 B2 | 2/2012 | Letertre | |
| 8,154,022 B2 | 4/2012 | Arena et al. | |
| 8,236,668 B2 | 8/2012 | Ohnuma et al. | |
| 2003/0153163 A1 | 8/2003 | Letertre et al. | |
| 2003/0219959 A1 | 11/2003 | Ghyselen et al. | |
| 2004/0014299 A1 | 1/2004 | Moriceau et al. | |
| 2004/0029359 A1 | 2/2004 | Letertre et al. | |
| 2004/0050483 A1 | 3/2004 | Ghyselen et al. | |
| 2004/0055998 A1 | 3/2004 | Letertre et al. | |
| 2004/0112866 A1 | 6/2004 | Maleville et al. | |
| 2004/0187766 A1 | 9/2004 | Letertre | |
| 2004/0241959 A1 | 12/2004 | Letertre et al. | |
| 2005/0000649 A1 | 1/2005 | Rayssac et al. | |
| 2005/0006740 A1 | 1/2005 | Letertre et al. | |
| 2005/0020031 A1 | 1/2005 | Letertre et al. | |
| 2005/0026394 A1 | 2/2005 | Letertre et al. | |
| 2005/0032330 A1 | 2/2005 | Ghyselen et al. | |
| 2005/0048736 A1 | 3/2005 | Kerdiles et al. | |
| 2005/0048739 A1 | 3/2005 | Kerdiles et al. | |
| 2005/0101105 A1 | 5/2005 | Ghyselen et al. | |
| 2005/0112885 A1 | 5/2005 | Rayssac et al. | |
| 2005/0170611 A1* | 8/2005 | Ghyselen et al. | 438/458 |
| 2005/0239270 A1 | 10/2005 | Fehrer et al. | |
| 2005/0258483 A1 | 11/2005 | Templier et al. | |
| 2005/0282358 A1 | 12/2005 | Di Cioccio et al. | |
| 2006/0073674 A1* | 4/2006 | Fitzgerald et al. | 438/458 |
| 2006/0079071 A1 | 4/2006 | Moriceau et al. | |
| 2006/0110899 A1 | 5/2006 | Bourdelle et al. | |
| 2006/0125057 A1 | 6/2006 | Di Cioccio et al. | |
| 2006/0192269 A1 | 8/2006 | Letertre et al. | |
| 2006/0220129 A1 | 10/2006 | Letertre | |
| 2006/0228820 A1 | 10/2006 | Kerdiles et al. | |
| 2006/0246687 A1* | 11/2006 | Kaiser et al. | 438/458 |
| 2007/0119893 A1 | 5/2007 | Rayssac et al. | |
| 2007/0254455 A1 | 11/2007 | Yamaguchi et al. | |
| 2007/0275492 A1* | 11/2007 | Huffaker et al. | 438/46 |
| 2008/0038902 A1* | 2/2008 | Lee | 438/458 |
| 2008/0194084 A1 | 8/2008 | Kononchuk et al. | |
| 2008/0223285 A1* | 9/2008 | Lee | 117/2 |
| 2008/0303118 A1 | 12/2008 | Arena et al. | |
| 2009/0111243 A1 | 4/2009 | Landru et al. | |
| 2010/0127353 A1 | 5/2010 | Letertre et al. | |
| 2010/0176490 A1 | 7/2010 | Letertre et al. | |
| 2011/0012200 A1 | 1/2011 | Allibert et al. | |
| 2011/0127581 A1 | 6/2011 | Bethoux et al. | |
| 2011/0143522 A1 | 6/2011 | Letertre et al. | |
| 2011/0165758 A1 | 7/2011 | Bourdelle et al. | |
| 2011/0177673 A1 | 7/2011 | Landru | |
| 2011/0183493 A1 | 7/2011 | Daval et al. | |
| 2011/0193201 A1 | 8/2011 | Kononchuk et al. | |
| 2011/0207295 A1 | 8/2011 | Landru et al. | |
| 2011/0266651 A1 | 11/2011 | Riou et al. | |
| 2011/0275226 A1 | 11/2011 | Landru et al. | |
| 2011/0278597 A1 | 11/2011 | Landru | |
| 2011/0291247 A1 | 12/2011 | Letertre et al. | |
| 2012/0048007 A1 | 3/2012 | Landru | |
| 2012/0088351 A1* | 4/2012 | Tauzin et al. | 438/458 |
| 2012/0094469 A1 | 4/2012 | Landru | |
| 2012/0094496 A1 | 4/2012 | Veytizou et al. | |
| 2012/0100692 A1 | 4/2012 | Letertre | |
| 2012/0112205 A1 | 5/2012 | Letertre | |

FOREIGN PATENT DOCUMENTS

| | | | |
|---|---|---|---|
| EP | 0786801 | 6/2003 | |
| FR | 2855909 B1 | 8/2005 | |
| FR | 2849715 B1 | 3/2007 | |
| FR | 2944914 A1 * | 10/2010 | H01L 21/301 |
| FR | 2944914 B1 | 5/2011 | |
| JP | 2003524876 A | 8/2003 | |
| JP | 2004519093 A | 6/2004 | |
| JP | 2004532515 A | 10/2004 | |
| JP | 2007318106 A | 12/2007 | |
| JP | 2009111373 A | 5/2009 | |
| TW | 201110199 A | 3/2011 | |

OTHER PUBLICATIONS

Taiwanese Office Action and Search Report for Taiwan Application No. 101122278 dated Jul. 2, 2014.

Chinese Office Action for Chinese Application No. 201210209949.3 dated Jun. 26, 2014, 12 pages.

Japanese Office Action for Japanese Application No. 2012-138156 dated Feb. 18, 2014, 4 pages.

Korean Office Action for Korean Application No. 10-2012-0065367 dated Aug. 25, 2014, 5 pages.

* cited by examiner

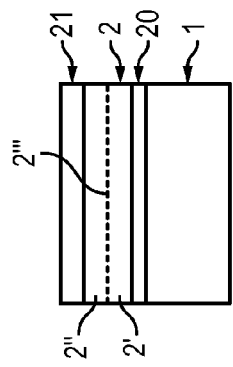
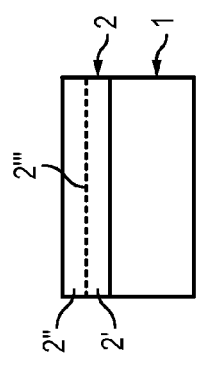
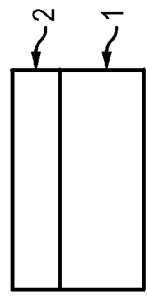
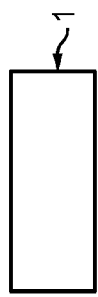
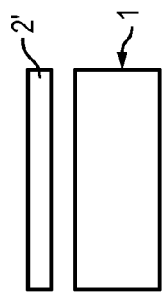
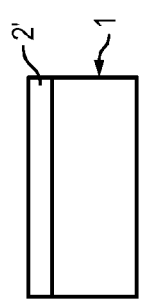
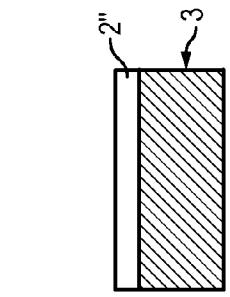
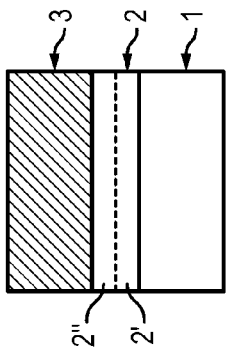
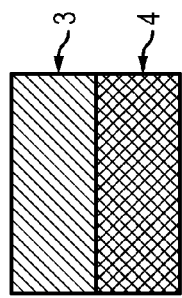
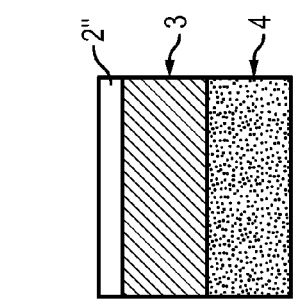
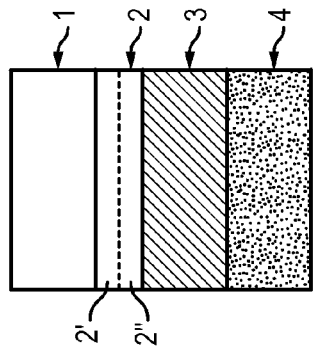

PROCESS FOR FABRICATING A SEMICONDUCTOR STRUCTURE EMPLOYING A TEMPORARY BOND

CROSS-REFERENCE TO RELATED APPLICATION

This application claims the benefit of right of priority under 35 U.S.C. §119(a) based on French Patent Application No. FR 1155548, filed Jun. 23, 2011 and entitled "Process for Fabricating a Semiconductor Structure Employing A Temporary Bond," the disclosure of which is hereby incorporated herein by this reference in its entirety.

TECHNICAL FIELD

The present invention relates to the production of semiconductor structures for electronic, optical or microelectronic applications.

More precisely, the invention relates to a process for fabricating a semiconductor structure by temporarily bonding one substrate to another.

The invention also relates to a semiconductor assembly employed in such a process.

BACKGROUND

In a process for fabricating a semiconductor structure, layers, for example, comprising integrated circuits may be transferred. Such transfers especially allow circuits to be attached to substrates other than those used to produce them, or else allow circuits to be stacked so as to form "3D" components.

If the thin layer to be transferred is of a small thickness (i.e., below 200 μm), it may, during transfer, be liable to crack or split or, more generally, it may be damaged.

A solution disclosed in EP 0,786,801 for reinforcing the layer to be transferred or the substrate to be treated comprises temporarily bonding a handle substrate to the substrate comprising the layer to be transferred. The layer to be transferred or the substrate to be treated may thus be freely handled and undergo all the fabrication steps necessary for its transfer or treatment.

In EP 0,786,801, the handle substrate comprises a cleavage zone that allows, at the end of the process, the handle substrate to be removed along this cleavage zone.

One problem is that such a handle substrate consumes material. Furthermore, it is not easy to recycle the remaining part in order to reuse it. This is because it is necessary to implement a polishing operation, thereby increasing the duration and cost of the process.

Another known solution, which does not consume material, consists in temporarily bonding, by means of an adhesive, the handle substrate to the substrate comprising the layer to be transferred.

In this case, during the transfer or treatment, the force associated with the attachment of the layer to be transferred and the handle substrate is withstood by the adhesive.

Once the transfer or treatment has been carried out, the handle substrate may be removed.

A problem arises from the use of an adhesive.

This is because adhesives can become unstable if exposed to the high temperatures employed in the treatments carried out on the substrate or during fabrication of semiconductor structures using a transfer.

Moreover, an adhesive layer does not allow sufficiently stable attachment of the substrate for certain treatments to be carried out thereon. This is the case when the substrate, for example, is thinned by grinding to below a thickness threshold, for example, of 200, 50 or 40 microns. The mechanical stress exerted in this step leads to strain in the layer resting on the insufficiently rigid adhesive layer, thereby, in turn, leading to non-uniform thinning of the substrate.

Furthermore, once the treatment has been carried out, the adhesive is completely removed by means of a chemical removal technique (dissolving in a solvent, for example). Such removal increases the duration of the fabrication process and risks damaging the semiconductor structure obtained.

BRIEF SUMMARY

The invention allows the drawbacks mentioned above to be alleviated.

Thus, according to a first aspect, the invention relates to a process for fabricating a semiconductor structure, characterized in that it comprises the following steps:
  providing a handle substrate comprising a seed substrate and a weakened sacrificial layer covering the seed substrate;
  joining the handle substrate with a carrier substrate;
  optionally treating the carrier substrate;
  detaching the handle substrate at the sacrificial layer so as to form the semiconductor structure; and
  removing any residue of the sacrificial layer present on the seed substrate.

By virtue of the process of the invention, on the one hand, the material of the seed substrate of the handle substrate may be chosen from a wide range of materials and, on the other hand, the remaining part of this substrate may be recycled in a particularly easy way in order to be reused in the same way.

Specifically, recycling of the remaining part of the handle substrate after the detachment step can be easily carried out: a simple selective etch of the sacrificial layer is enough to allow recycling of the handle substrate.

This type of recycling process is much less expensive than a polishing-based recycling technique, such as is necessarily the result of the process described in EP 0,786,801, for example.

Another advantage of the invention is that the recycling does not reduce the thickness of the handle substrate since the handle substrate is covered with a sacrificial layer, it being this layer alone that is consumed in the recycling. The handle substrate is, therefore, theoretically infinitely reusable. It is thus possible to make cost savings relative to known processes that involve transfer of part of a silicon handle substrate and its recycling, part of the thickness of this substrate being consumed in these processes.

The following are other aspects of the process according to the first aspect of the invention:
  the sacrificial layer is weakened by introducing atomic species into the sacrificial layer of the handle substrate;
  the seed substrate has a thermal expansion coefficient $CTE_1$ near the thermal expansion coefficient $CTE_2$ of the carrier substrate such that $|CTE_1-CTE_2|/CTE_1<50\%$;
  the handle substrate comprises an intermediate layer placed between the seed substrate and the sacrificial layer in order to promote adhesion of the material forming the sacrificial layer to the seed substrate;
  the sacrificial layer has a weak zone and defines a layer located between the surface of the handle substrate and the weak zone;

the process comprises, before the detachment step, a step consisting in joining the carrier substrate to a host substrate;

the seed substrate is chosen so as to have a thermal expansion coefficient CTE1 near the thermal expansion coefficient CTE2 of the host substrate;

the carrier substrate comprises an integrated-circuit part;

the detachment step consists in supplying energy by annealing at a temperature of at least 200° C.;

the introduction of atomic species consists in exposing an area of the handle substrate to atomic species implantation, at a dose of between $1 \times 10^{15}$ ions/cm$^2$ and $1 \times 10^{17}$ ions/cm$^2$ and at an energy of between 5 keV and 500 keV;

the introduction of atomic species consists in diffusing atomic species into the handle substrate by bringing the surface of the handle substrate into contact with a chemical species that will penetrate into the handle wafer by chemical diffusion;

the introduction of atomic species involves:
before the species introduction, creating a confinement layer in the handle substrate; and
after the species introduction, exposing the handle substrate to a temperature of at least 200° C. with a view to promoting migration of the introduced species towards the confinement layer;

the joining consists in bonding the handle substrate to the carrier substrate;

the joining is achieved by molecular adhesion;

the sacrificial layer is a polysilicon layer; and the seed substrate is: a single crystal substrate, or an amorphous or polycrystalline substrate, or a ceramic, or a metal.

According to a second aspect, the invention relates to a handle substrate comprising a seed substrate and a weakened sacrificial layer.

The following are other aspects of the handle substrate according to the second aspect of the invention:

the sacrificial layer contains a density of H and/or of He lying between $1 \times 10^{16}$ at/cm$^3$ and $1 \times 10^{20}$ at/cm$^3$;

the sacrificial layer is made of polysilicon;

the seed substrate is a single crystal substrate, an amorphous or polycrystalline substrate, a ceramic or a metal;

it has an RMS surface roughness of 10 Ångströms or less;

it has an additional surface layer that simplifies subsequent joining of the handle substrate with the carrier substrate; and the additional layer is made of silicon oxide.

In addition, according to a third aspect, the invention relates to a process for fabricating a handle substrate comprising the following steps: forming a sacrificial layer on a seed substrate and introducing an atomic species into the sacrificial layer.

DESCRIPTION OF THE DRAWINGS

Other features and advantages of the invention will become more clear from the following description, which is purely illustrative and non-limiting and which must be read with regard to the appended drawings in which:

FIGS. 2 through 12 illustrate configurations found in a process according to one embodiment of the invention.

In all the figures, similar elements have been given identical reference numbers.

DETAILED DESCRIPTION OF THE INVENTION

Figure 1:
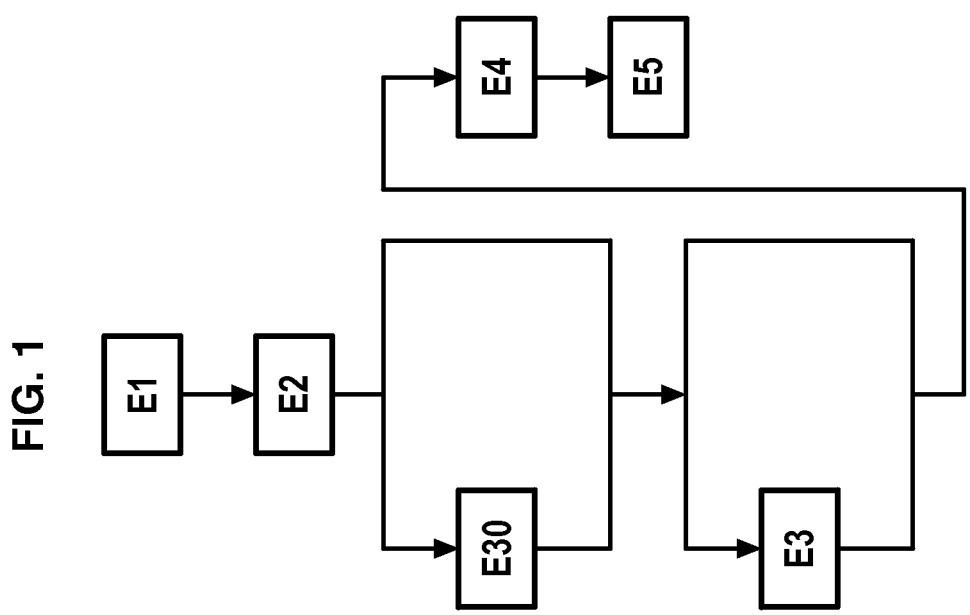
FIG. 1 illustrates the steps of a process according to one embodiment of the invention.

The following description is given with regard to FIGS. 1 through 12, which illustrate steps in a process for fabricating a semiconductor structure employing a handle substrate to support a carrier substrate.

The expression "semiconductor structure" is understood to mean any structure that is used in the production of a semiconductor device. A semiconductor structure may comprise conductors, semiconductors and/or insulators. This may be a layer comprising or not comprising microcomponents or finished or partially finished microcomponents per se.

The expression "handle substrate" is understood to mean a composite structure, the function of which is to act as a temporary mechanical support for a substrate or structure.

The expression "carrier substrate" is understood to mean a substrate that will be joined, in particular, temporarily, to a handle substrate and that may be subjected to treatments. This may, for example, be a substrate comprising finished or partially finished microcomponents to be transferred to a host substrate.

The expression "host substrate" is understood to mean a substrate intended to receive (typically by transfer) a substrate or a structure.

The expression "stop layer" is understood to mean the first layer that is not removed during the recycling operation.

In a process for fabricating a semiconductor structure, in a first step E1, a handle substrate 1, 2 is provided comprising a seed substrate 1 and a sacrificial layer 2 covering the seed substrate 1.

The sacrificial layer 2 is weakened or has been weakened beforehand, so that, in a fabrication process, it is possible either to provide the handle substrate with the previously weakened sacrificial layer 2 or to weaken the sacrificial layer 2 in the fabrication process.

The sacrificial layer 2 is typically weakened by introducing atomic species into the sacrificial layer 2. The sacrificial layer 2 is preferably made of polysilicon, because detachment is particularly easy when this material is used. In this respect, the reader may refer to document C. H. Yun, N. Quitoriano, N. W. Cheung: "Polycrystalline silicon layer transfer by ion-cut," *Applied Physics Letters*, Vol. 82, No. 10, March 2003.

Furthermore, an intermediate layer 20 may be provided, placed between the seed substrate and the sacrificial layer 2, this intermediate layer ensuring good adhesion of the sacrificial layer 2 to the seed substrate 1. This intermediate layer 20 may serve both as a tie layer and as an etch-stop layer during optional recycling E5 of the handle substrate, the recycling consisting in removing any residue of the sacrificial layer 2 present on the seed substrate 1 (see below). It will be noted that this layer is, in particular, necessary when the sacrificial layer 2 is made of the same material as the substrate 1.

The sacrificial layer 2 covers the seed substrate 1. This sacrificial layer 2 may be covered with an additional layer 21 that makes it easier to subsequently join the handle substrate with the carrier substrate 3. Thus, this additional layer 21 may take the form of a superficial oxide bonding layer. Whether this layer is present or not, it is important for the exposed surface of the handle substrate to be compatible with the subsequent assembly step E2. Thus, if it is envisaged to temporarily join the handle substrate with the carrier substrate by molecular bonding, the RMS surface roughness of the handle substrate must be about 10 Ångströms or less.

The introduction of atomic species has the objective of forming a weak zone 2''' buried in the sacrificial layer 2 covering the seed substrate 1. The atomic species introduced may be hydrogen or helium ions, inert-gas ions or even fluorine or boron ions, whether alone or in combination. Hydrogen and helium are particularly advantageous because they are very commonly implanted.

Thus, the handle substrate is liable to separate in the weak zone 2''' when it receives energy in this zone (for example, when it is heated and/or a mechanical stress is applied).

The parameters of the atomic species introduction and, in particular, the dose of species introduced, may be adjusted so as to prevent the handle substrate from breaking or separating along the weak zone during assembly of the handle substrate with the carrier substrate 3 or during treatments carried out on the substrate 3, in particular, if these treatments comprise a heat treatment step.

This allows the handle substrate to be detached from the carrier substrate 3 during subsequent treatment steps, as will be described below.

The depth to which the species are introduced into the handle substrate so as to produce the weak zone is mainly a function of the energy with which the species are introduced into the handle substrate. Insofar as the species introduced are indeed essentially located in the sacrificial layer, the exact position of the weakened zone is not critical. By way of non-limiting example, the atomic species may be introduced into the sacrificial layer 2 to a depth of between 50 nm and several microns.

The introduction of atomic species may consist in exposing an area of the handle substrate to atomic species implantation, at a dose of between $1 \times 10^{15}$ ions/cm$^2$ and $1 \times 10^{17}$ ions/cm$^2$ and at an energy of between 5 keV and 500 keV.

Alternatively, the introduction of atomic species may consist in diffusing atomic species into the handle substrate, i.e., of bringing the surface of the handle substrate into contact with a chemical species that will penetrate into the handle substrate by chemical diffusion. This may be achieved using a plasma.

This introduction may also be achieved during the formation of the sacrificial layer 2, for example, by incorporating a large amount of hydrogen in the layer during its deposition.

It will be noted that, in contrast to known implantation-based layer transfer techniques, it is not necessary, in the context of this invention, to precisely locate the implanted species so as to define a layer to be transferred. It is indeed sufficient to incorporate enough species in the layer to allow defects such as voids or platelets to form under the effect of a heat treatment, which defects will subsequently allow the seed substrate 1 to be detached. The H and/or He density in the sacrificial layer 2 lies between $1 \times 10^{16}$ at/cm$^3$ and $1 \times 10^{20}$ at/cm$^3$. In the polysilicon sacrificial layer 2, this density is about $1 \times 10^{18}$ at/cm$^3$.

Furthermore, whatever method of introducing atomic species is used, the species introduction may be combined with a confinement in which:
- before the species introduction, a confinement layer is created in the handle substrate; and
- after the species introduction, the handle substrate is exposed to a temperature of at least 100° C. with a view to promoting migration of the introduced species towards the confinement layer.

As has already been mentioned, in a step E2, the handle substrate 1, 2 is joined with a carrier substrate 3.

This assembly step E2 allows the carrier substrate 3 to be provided with a mechanical support.

Advantageously, the material of the seed substrate 1 forming the handle substrate may be chosen so as to have a thermal expansion coefficient near the thermal expansion coefficient of the carrier substrate. Preferably, $|CTE1-CTE2|/CTE1<50\%$, where CTE1 is the thermal expansion coefficient of the seed substrate and CTE2 is the thermal expansion coefficient of the carrier substrate.

Again advantageously, the seed substrate 1 may be made of silicon or any other material that can be provided in the form of a substrate compatible with the treatments carried out on the carrier substrate 3.

Thus, this seed substrate 1 must be able to withstand heat treatments at a few hundred degrees, for example, up to 500° C., must be able to withstand mechanical stresses and must be chemically inert in order to withstand chemical-mechanical polishing (CMP) or grinding, and must be sufficiently flexible to be able to be strained during a molecular bonding step. In this respect, the seed substrate 1 will possibly be chosen from a single crystal (silicon, SiC, quartz, sapphire) substrate, an amorphous or polycrystalline (polySiC, glass, glass-ceramic) substrate, a ceramic (aluminium or silicon nitride, mullite, alumina) or a metal (tungsten, molybdenum).

The assembly step E2 may consist in bonding the handle substrate 1, 2 to the carrier substrate 3.

It is the layer 2" that then makes contact with the carrier substrate 3. Preferably, this is a molecular bonding operation, which, therefore, does not require an adhesive or any other form of adhesive layer, the limitations of which were mentioned in the introduction.

Once joined with the substrate 1 that supports it, the substrate 3 may undergo one or more treatments. For example, in the case where circuits are joined, the carrier substrate 3 is thinned from the back side and joined E2', for example, bonded, to a final host substrate 4.

In this case, the material of the seed substrate 1 may be chosen so as to have a thermal expansion coefficient near the thermal expansion coefficient of the final host substrate 4. Preferably $|CTE1-CTE3|/CTE1<50\%$, where CTE1 is the thermal expansion coefficient of the seed substrate and CTE3 is the thermal expansion coefficient of the final host substrate.

Next, in a fourth step, the handle substrate is detached E4 at the sacrificial layer 2 and, in particular, at the weak zone 2''' in the case where the weakening was achieved by introducing atomic species.

Alternatively, or in a complementary way, before this detachment step has been carried out, a step may be implemented consisting in joining E30 the carrier substrate 3 and the layer 2" to a host substrate 4.

The detachment step E3 especially consists in supplying energy by annealing at a temperature of at least 200° C. In addition to this heat treatment, a mechanical stress may be applied to the weakened zone in order to achieve this detachment.

Thus, in the case where the assembly step E30 is carried out, the handle substrate allows the carrier substrate 3 to be placed on the host substrate 4 without damaging the carrier substrate 3.

Furthermore, the remaining part of the handle substrate may easily be recycled by selectively etching any residue of the sacrificial layer 2'.

For this purpose, a step E5 of removing any residue of the sacrificial layer 2 from the seed substrate 1 is implemented.

Recycling of the remaining part of the carrier substrate does not reduce the thickness of the handle substrate since it is the residual layer 2 that is consumed.

This makes it possible to reduce substrate consumption relative to known processes that involve transferring part of a silicon substrate before recycling it, using up part of the thickness of this substrate.

A semiconductor structure is obtained using the process described above, the structure possibly consisting of the host substrate 4, the carrier substrate 3 and possibly any residue of the layer 2' originating from the sacrificial layer of the handle substrate. This residue will, for example, be removed by polishing or using a chemical treatment in the step E5 of removing any residue of the sacrificial layer 2 present on the semiconductor structure.

Finally, the fabrication process may comprise a step of recycling the handle substrate, especially consisting in smoothing the free surface or removing the layer 2".

Such smoothing or removal may be achieved using a grinding process, a wet-etching process or a chemical-mechanical polishing process.

In the case where an intermediate layer 20 is placed between the seed substrate 1 and the sacrificial layer 2, the intermediate layer 20 may be used as a stop layer. However, in the case where this intermediate layer is not present, the seed substrate 1 acts as a stop layer.

The invention claimed is:

1. A method of fabricating a semiconductor structure, comprising:
   providing a handle substrate comprising a seed substrate and a weakened sacrificial layer covering the seed substrate;
   joining the handle substrate with a carrier substrate;
   treating the carrier substrate while it remains joined to the handle substrate;
   after treating the carrier substrate, joining the carrier substrate to a host substrate while the carrier substrate remains adjoined to the handle substrate;
   after joining the carrier substrate to the host substrate, detaching the handle substrate at the weakened sacrificial layer to form the semiconductor structure; and
   removing any residue of the sacrificial layer present on the seed substrate.

2. The method of claim 1, wherein the sacrificial layer is weakened by introducing atomic species into the sacrificial layer of the handle substrate.

3. The method of claim 2, wherein introducing atomic species into the sacrificial layer comprises exposing an area of the handle substrate to atomic species implantation at a dose of between $1 \times 10^{15}$ ions/cm$^2$ and $1 \times 10^{17}$ ions/cm$^2$ and an energy of between 5 keV and 500 keV.

4. The method of claim 2, wherein introducing atomic species into the sacrificial layer comprises diffusing atomic species into the handle substrate by bringing the handle surface into contact with a chemical species and penetrating the chemical species into the handle wafer by chemical diffusion.

5. The method of claim 2, wherein introducing atomic species into the sacrificial layer comprises:
   creating a confinement layer in the handle substrate prior to introducing atomic species into the sacrificial layer; and
   exposing the handle substrate to a temperature of at least 200° C. to promote migration of the introduced species toward the confinement layer after introducing atomic species into the sacrificial layer.

6. The method of claim 1, wherein the seed substrate has a thermal expansion coefficient CTE1 near the thermal expansion coefficient CTE2 of the carrier substrate such that (CTE1−CTE2)/CTE1<50%.

7. The method of claim 1, wherein the handle substrate comprises an intermediate layer placed between the seed substrate and the sacrificial layer to promote adhesion of the sacrificial layer to the seed substrate.

8. The method of claim 1, wherein the sacrificial layer has a weak zone and defines a layer located between a surface of the handle substrate and the weak zone.

9. The method of claim 1, wherein the seed substrate is chosen to have a thermal expansion coefficient CTE1 near the thermal expansion coefficient CTE2 of the host substrate.

10. The method of claim 1, wherein the carrier substrate comprises an integrated-circuit.

11. The method of claim 1, wherein detaching the handle substrate at the weakened sacrificial layer comprises supplying energy by annealing at a temperature of at least 200° C.

12. The method of claim 1, wherein joining the handle substrate with the carrier substrate comprises bonding the handle substrate to the carrier substrate.

13. The method of claim 12, wherein joining the handle substrate with a carrier substrate comprises bonding the handle substrate with the carrier substrate by molecular adhesion.

14. The method of claim 1, wherein the seed substrate is selected from the group consisting of:
   a single-crystal substrate;
   an amorphous or polycrystalline substrate;
   a ceramic; and
   a metal.

15. The method of claim 1, further comprising treating the carrier substrate.

16. A method of fabricating a semiconductor structure, comprising:
   providing a handle substrate comprising a seed substrate and a weakened sacrificial layer covering the seed substrate, wherein the sacrificial layer comprises a polysilicon layer;
   joining the handle substrate with a carrier substrate;
   joining the carrier substrate to a host substrate while the carrier substrate remains adjoined to the handle substrate;
   after joining the carrier substrate to the host substrate, detaching the handle substrate at the weakened sacrificial layer to form the semiconductor structure; and
   removing any residue of the sacrificial layer present on the seed substrate.

* * * * *